(12) United States Patent
Nakamura

(10) Patent No.: US 7,420,855 B2
(45) Date of Patent: Sep. 2, 2008

(54) SEMICONDUCTOR MEMORY DEVICE

(75) Inventor: Munenori Nakamura, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 1 day.

(21) Appl. No.: 11/724,210

(22) Filed: Mar. 15, 2007

(65) Prior Publication Data
US 2007/0285994 A1    Dec. 13, 2007

(30) Foreign Application Priority Data
Apr. 27, 2006   (JP) ............................. 2006-123572

(51) Int. Cl.
*G11C 7/10*   (2006.01)
(52) U.S. Cl. ..................... 365/189.05; 365/189.04; 365/230.06
(58) Field of Classification Search ............ 365/189.04, 365/189.05, 189.09, 230.06, 185.23, 185.24
See application file for complete search history.

(56) References Cited

U.S. PATENT DOCUMENTS

| | | | |
|---|---|---|---|
| 4,882,507 A * | 11/1989 | Tatsumi et al. ................. | 326/28 |
| 5,544,117 A * | 8/1996 | Nakayama et al. ..... | 365/185.22 |
| 6,549,480 B2 * | 4/2003 | Hosogane et al. ........... | 365/226 |
| 2002/0024230 A1 * | 2/2002 | Pfertner et al. ......... | 296/107.07 |
| 2007/9253274 * | 11/2007 | Miyamoto ............. | 365/230.03 |

FOREIGN PATENT DOCUMENTS

JP    06-259320    9/1994

* cited by examiner

*Primary Examiner*—Gene N. Auduong
(74) *Attorney, Agent, or Firm*—Studebaker & Brackett PC; Donald R. Studebaker

(57) ABSTRACT

Reducing power consumption of a semiconductor memory device having a serial interface is disclosed. After parallel read-out data from a memory-cell matrix 14 are held in a data latch 17, the parallel read-out data are selected sequentially by a serial output selector 18 according to timing signals SL0-SL15 from a controller 20 and are outputted serially from an output buffer 19 as an output data DO. In an activating control unit 23, outputting an operation control signal AC to a gate-voltage generating unit 21, a drain-voltage generating unit 22, and a sense amplifier 16 is being halted during from when a timing signal SL0 is finished to when a timing SL10 is finished. Consequently, during the above mentioned period, the unnecessary operations of the gate-voltage generating unit 21, the drain-voltage generating unit 22, and the sense amplifier 16 are being halted and then the power consumption thereof can be reduced.

2 Claims, 6 Drawing Sheets

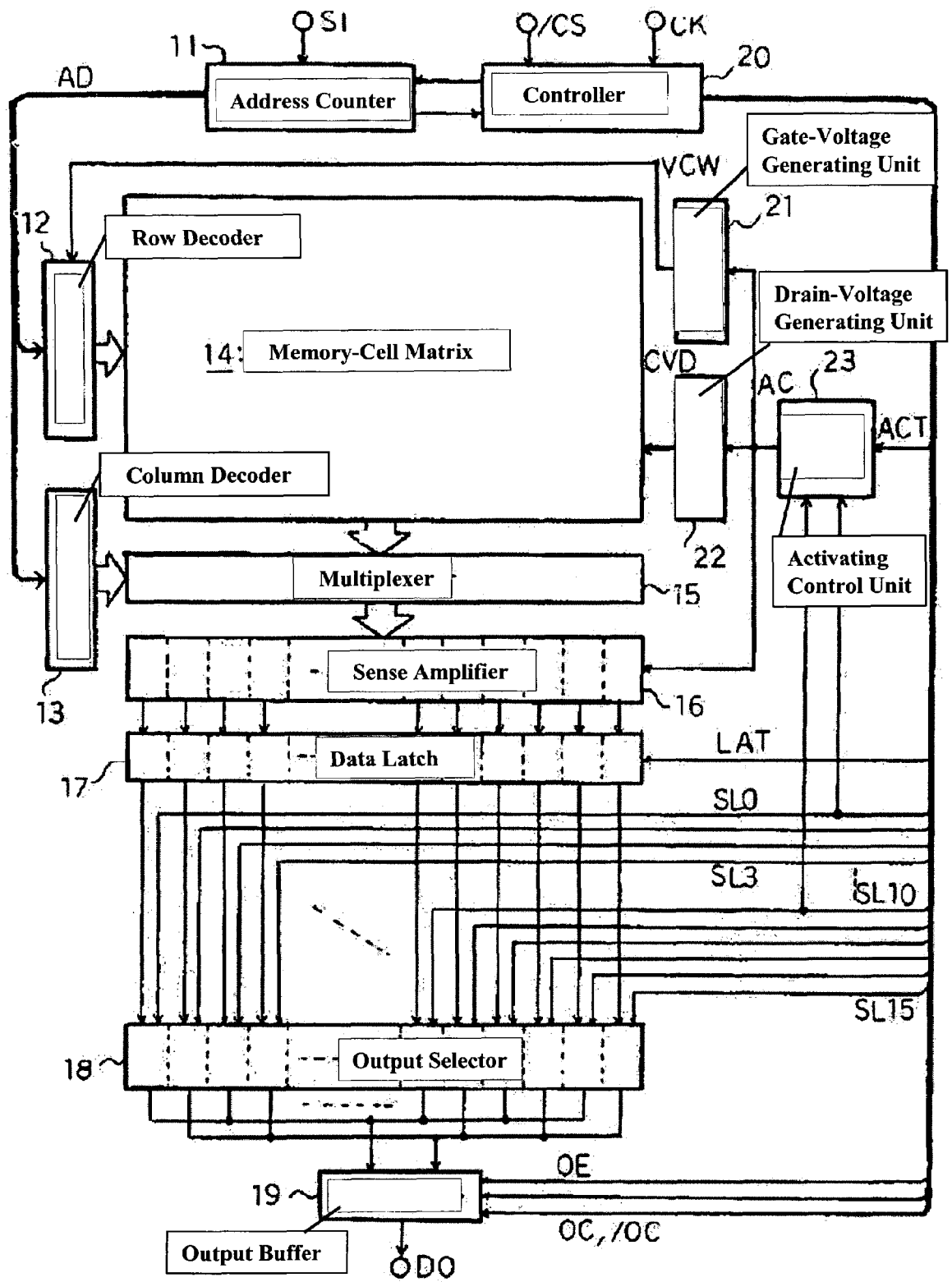
Fig.1 Semiconductor Memory Device according to the First Embodiment

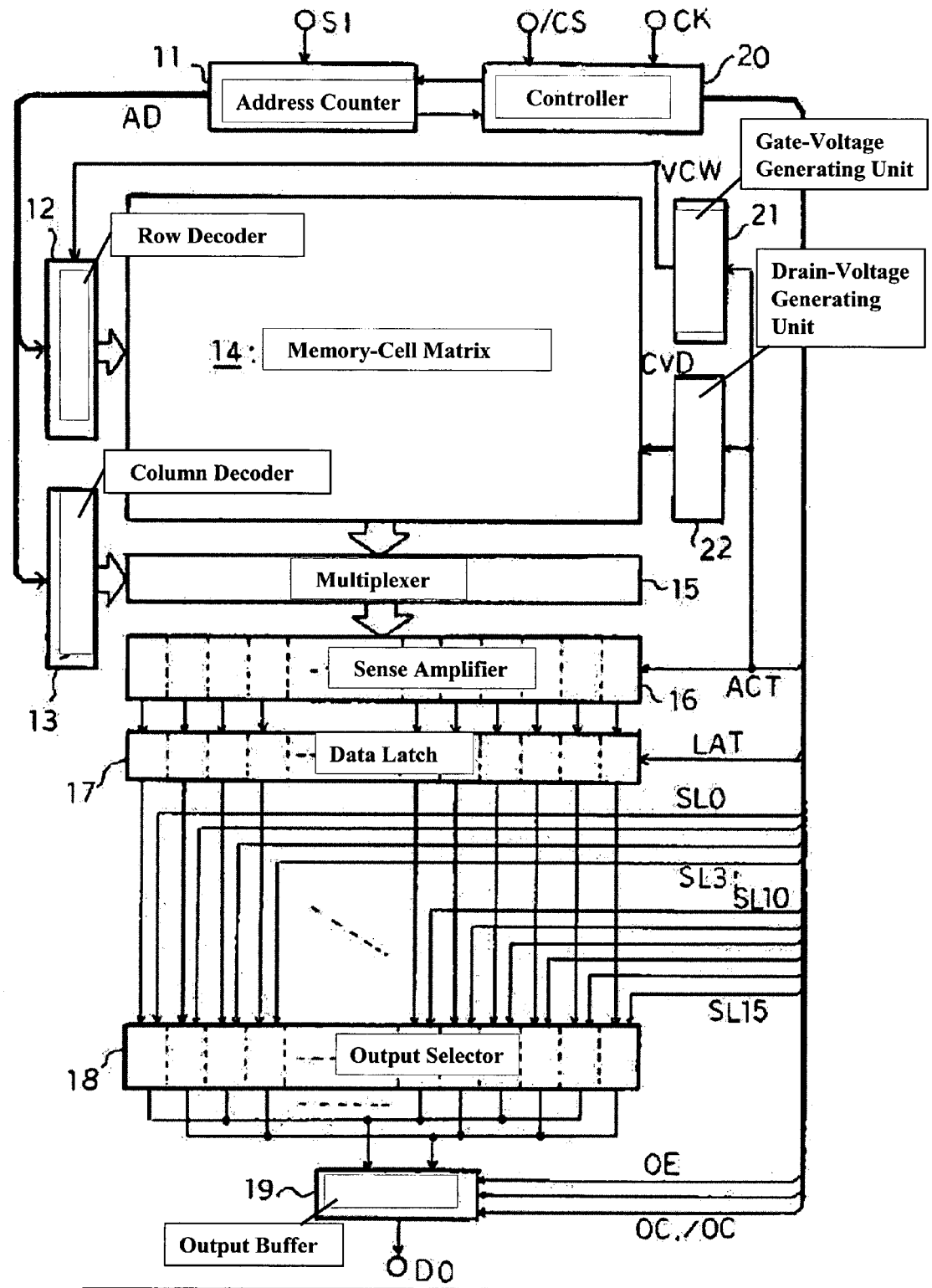
Fig.2 Conventional Semiconductor Memory Device

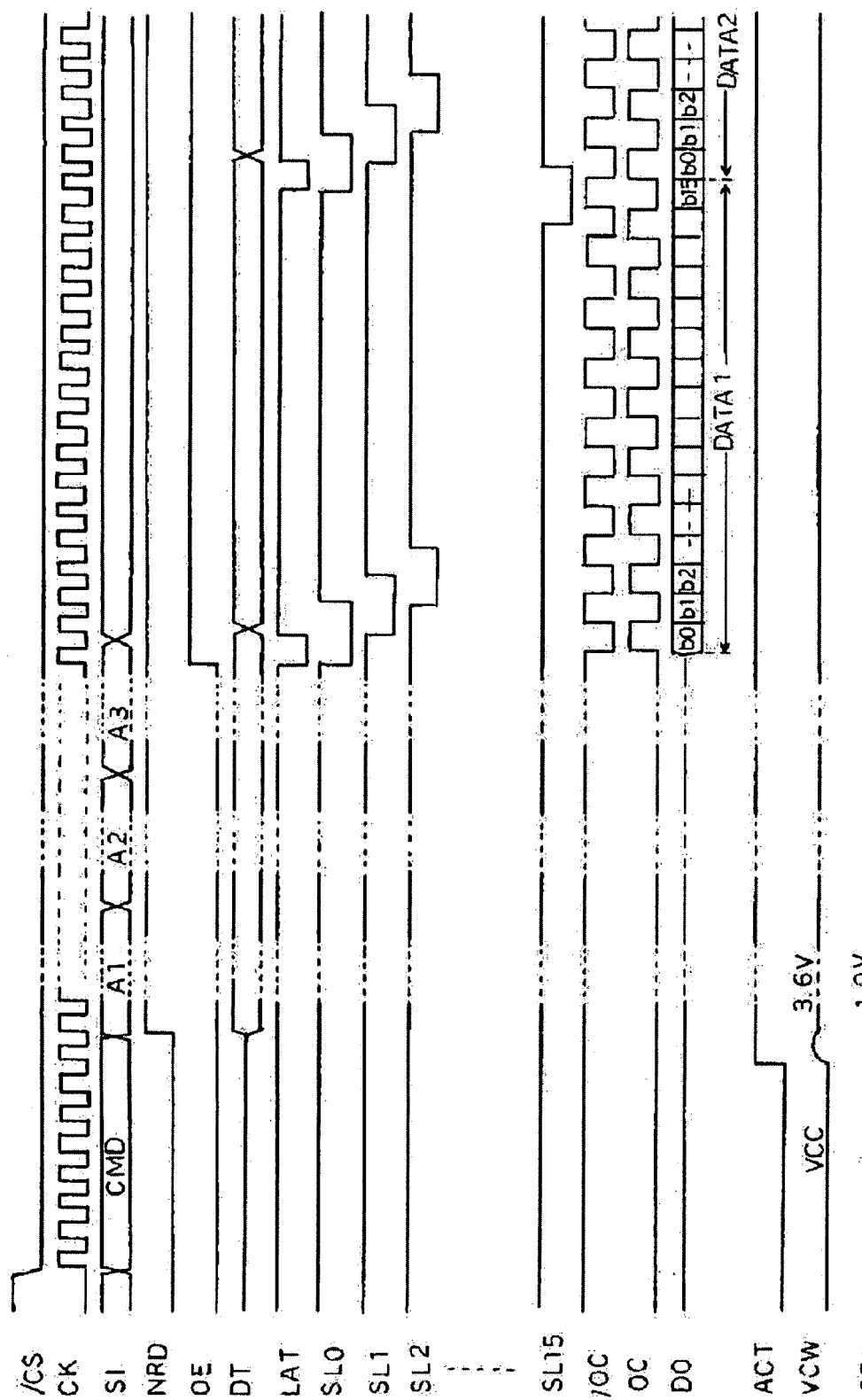

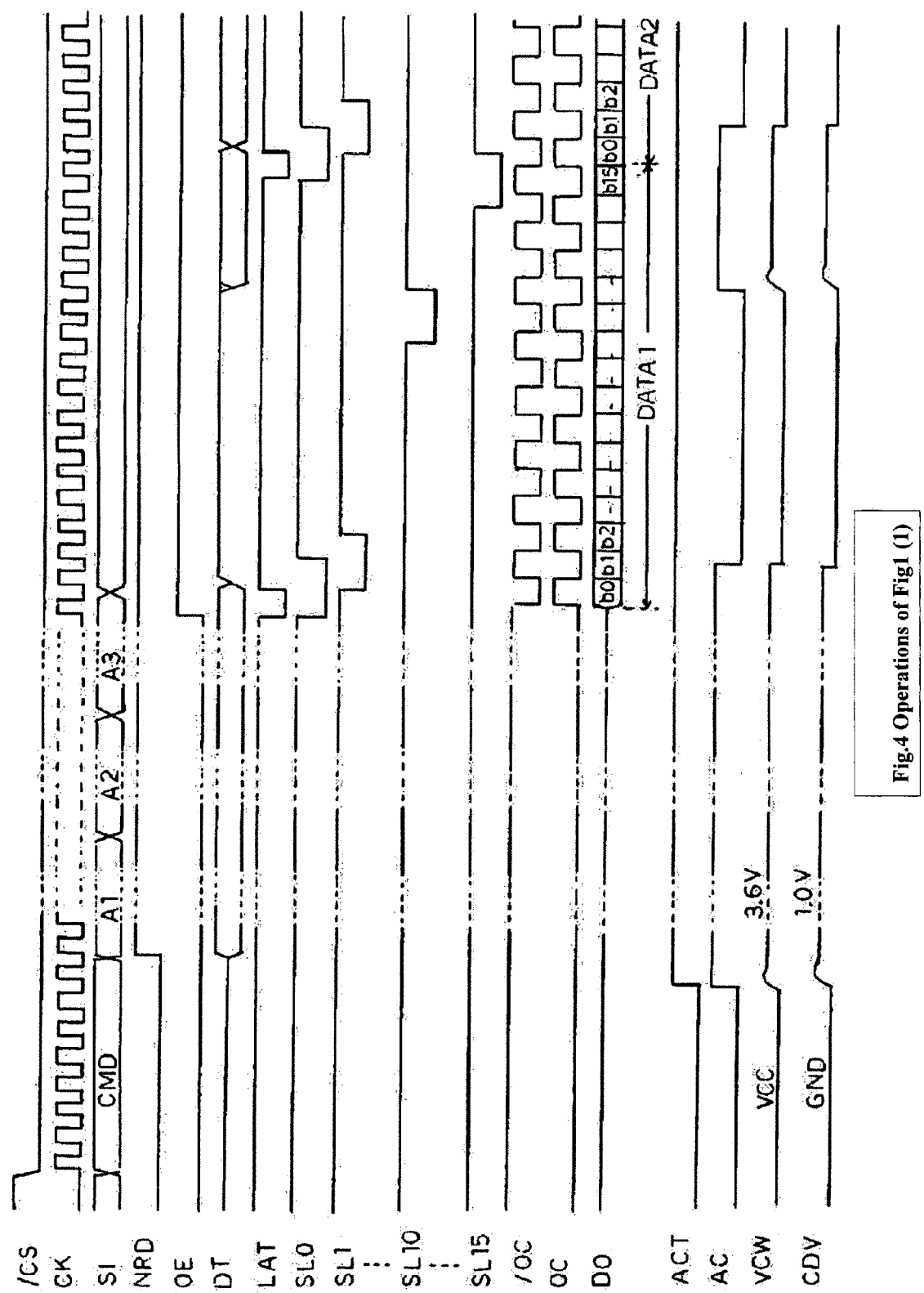
Fig.4 Operations of Fig1 (1)

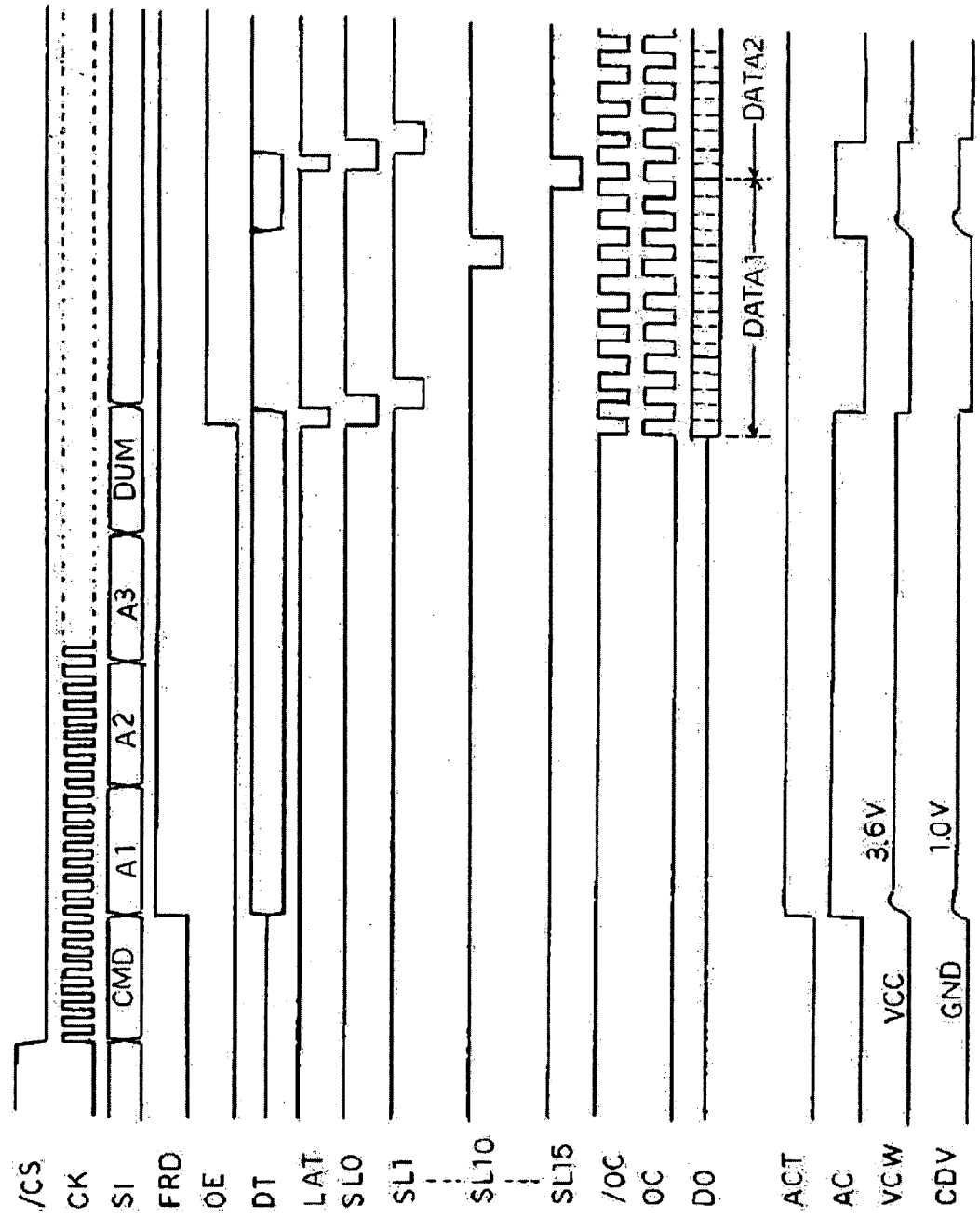
Fig.5 Operations of Fig1 (2)

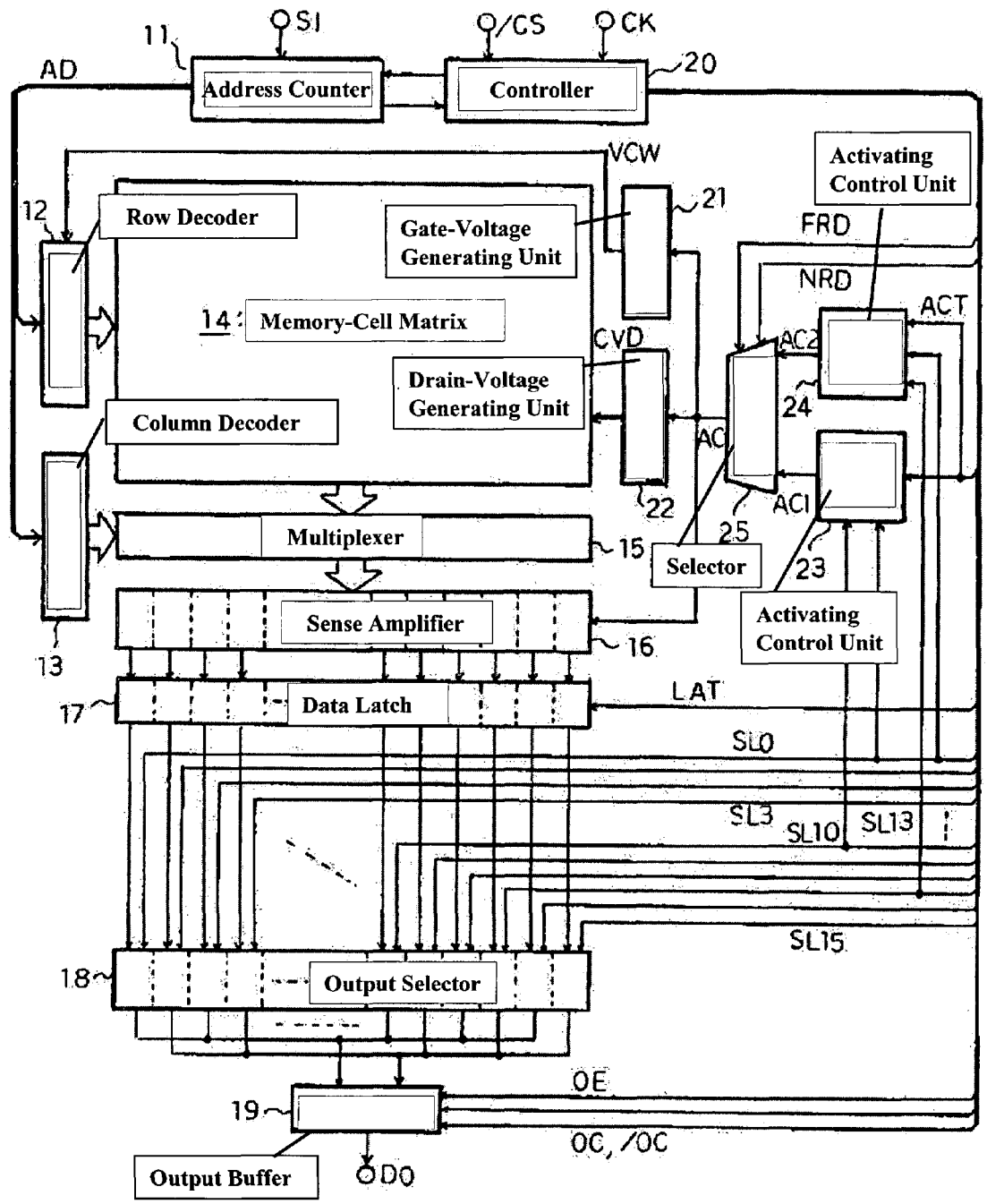
Fig.6 Semiconductor Memory Device according to the Second Embodiment

SEMICONDUCTOR MEMORY DEVICE

BACKGROUND OF THE INVENTION

Field of the Invention

The present invention relates to a semiconductor memory having serial interface, especially relates to reduction of the power consumption thereof.

FIG. 2 is a view of configuration diagram of the conventional semiconductor memory device.

The above semiconductor memory device is a non-volatile memory being capable of one-time electrical writing and being inputting and outputting address signal or data between inside and outside circuits thereof using serial interface. However, since the present invention relates to read operations thereof, the explanation of write circuits is omitted.

The above semiconductor device includes an address counter 11 for converting an address signal AD in a serial signal SI being provided serially by the outside to parallel data and for holding the above converted data, a row decoder 12 being provided with the upper bits (row address) of the above address signal AD held in the above address counter 11, and a column decoder 13 being provided with the lower bits (column address).

The row decoder 12 decodes the row address from the address counter 11 and drives word lines of a memory-cell matrix 14. Furthermore, the column decoder 13 decodes the column address from the address counter 11 and outputs a select signal to a multiplexer 15.

The memory-cell matrix 14 not shown in figures consists of a plural of word lines placed in parallel, a plural of drain lines placed across the above word lines, and MOS transistors having floating gates placed at the crossing points of the above word lines and the above drain lines as memory-cells. The control gate of the memory-cell is connected to the word line, the drain is connected to the drain line, and the drain is connected to the drain line, the source is connected to the bit-line placed in parallel to the above drain line, and the above bit-line is connected to the multiplexer 15.

The multiplexer 15 selects 16 bit-lines corresponding to the column address out of the bit-lines connected to the memory-cell matrix 14, based on the select signal from the column decoder 13 and connects the above 16 bit-lines to a sense amplifier 16. The sense amplifier 16 amplifies a slight voltage difference arisen between the above selected bit-lines to the predetermined logic level.

A data latch 17 for latching the 16-bit data from the above sense amplifier 16 at the timing of a latch signal LAT is connected to the output side of the sense amplifier 16. Furthermore, an output selector 18 and an output buffer 19 for outputting the 16-bit data held in the data latch 17 at the given timing as a output data DO are connected to the output side of the data latch 17.

Moreover, the aforementioned semiconductor memory device includes a controller 20 for controlling the whole operation based on a chip select signal /CS and a clock signal CK given from the outside, a gate-voltage generating unit 21 for driving the memory-cell matrix 14, and a drain-voltage generating unit 22. The controller 20 outputs an activating signal ACT to the sense amplifier 16, the gate-voltage generating unit 21, the drain-voltage generating unit 22, a latch signal LAT to the data latch 17, timing signals SL0-SL16 to the output selector 18, and a output enable signal OE and output clocks OC, /OC to the output buffer 19.

The gate-voltage generating unit 21 generates a gate-voltage VCW (for example, 3.6V) for driving the selected word lines of the memory-cell matrix 14 while the activating signal ACT is provided. Additionally, the drain-voltage generating unit 22 generates a drain-voltage CDV (for example, 1.0V) given to the drain lines of the memory-cell matrix 14 while the activating signal ACT is provided.

FIG. 3 is a view of a signal waveform diagram showing an example of writing operations in the semiconductor memory device of FIG. 2. The semiconductor memory device thereof is activated by falling of the chip select signal /CS, and then a serial signal SI from the outside is inputted serially synchronized with the rising edge of the clock signal CK. The first 8 bits of the above serial signal SI represents a command signal CMD, and it is assumed that a normal read mode is set in the case hereof. By the above mode setting, the enable signal NRD rises and the activating signal ACT rises. By rising of the activating signal ACT, the gate-voltage generating unit 21 and the drain-voltage generating unit 22 are driven, then the gate-voltage VCW rises from a power-supply voltage VCC to 3.6V and the drain-voltage CDV rises from a ground voltage GND to 1.0V.

An 24-bit address signal AD of address signals A1, A2, A3 following the command signal CMD in the serial signal SI is set into the address counter 11. Subsequently, the address signal AD set in the address counter 11 is divided and provided the row decoder 12 and the column decoder 13, then the corresponding 16-bit address data is read out from the memory-cell matrix 14 through the multiplexer 15. The read data thereof is amplified to the predetermined logic level by the sense amplifier 16 and provided the data latch 17.

When the latch signal LAT from the controller 20 is level "L", the data is inputted to the data latch 17, and when the latch signal is changed to level "H", the input data is held therein. The latched data of the data latch 17 is provided the output selector 18 in parallel. From the falling edge of the 32nd clock after address setting by the serial signal SI is finished, the output enable signal OE is set to level "H" and activated, then the output of the output clocks OC. /OC is started.

Furthermore, the timing signals SL0-SL15 are changed to level "L" sequentially, and during the period of the above level "L", the data of the data latch 17 are sequentially transferred to the output buffer 19 through the output selector 18. The transferred data are serially outputted from the output buffer 19 as the output data DO, synchronized with output clocks OC, /OC.

In every 16 clocks, the value of the address counter 11 is counted up, and the sequential address data of the memory-cell matrix 14 is read out sequentially and serially.

The operation of the normal read mode is explained before, however, there is a high-speed read mode for conducting read operation by faster clock. In the high-speed read mode, the sequence is composed as follows. After the 24-bit address signal AD of the address signals A1, A2, A3 following the command signal CMD is provided, dummy 8-clock cycles are inserted to acquire time for reading the first data, and then the read operation is started. The operations following thereafter are the same as in normal read mode.

Patent document: Japanese Patent Laid-Open Number H6-259320.

SUMMARY OF THE INVENTION

However, in the aforementioned semiconductor memory device, time of 16 clocks is reserved as a time for one time read-out during from when a read address is set up to when the read address is changed to the next read address, that is, as one data-read time. The above time is an excess time, compared to data read time from the memory-cell matrix. For example, the frequency of the clock signal CK is 20 MHz in the normal read mode, and 50 MHz in the high-speed read mode. Consequently, the serial read time of one word is 800 ns in the normal read mode, and 320 ns in the high-speed read mode, then the above read times are much longer than 100 ns of the average read time of the memory-cell matrix.

Meanwhile, during the serial output of the read-out data to the outside, the sense amplifier 16, the gate-voltage generating unit 21, and the drain-voltage generating unit 22 are being activated, therefore, there is a problem that unnecessary power is consumed.

The object of the present invention is reducing power consumption of a semiconductor memory device having a serial interface.

The solution of the object:

The feature is that semiconductor memory device of the present invention includes;

a memory-cell matrix having a plural of memory-cells placed in a matrix shape and for outputting in parallel one-word signal of the address selected by the read-out select signal, a amplifying unit for amplifying one-word signal outputted from the above memory-cell matrix for and generating one-word data, a data holding unit for holding one-word data generated by the above amplifying unit, a data outputting unit for outputting serially one-word data held in the above data holding unit according to an output-timing signal, a voltage generating unit for generating a voltage for the above read-out select signal, and an activating control unit for outputting an operation-control signal according to the above output-timing signal so as to activate the above voltage generating unit and the above amplifying unit during from when the above read-out select signal is generated to when the one-word signal is outputted from the above memory-cell matrix according to the corresponding select signal and the one-word signal is held by the above data holding unit.

The Effect of the Invention

The present invention includes the activating control unit for outputting the operation control signal according to the output-timing signal to activate the voltage-generating unit and the amplifying unit during from when the one-word signal is outputted from the memory-cell according to the read-out select signal to when the one-word signal is held by the data holding unit. By the above configuration, operations of the voltage-generating unit and the amplifying unit are being halted by the activating control unit while the operations are not necessary, then there is an effect that the unnecessary power consumption can be reduced.

BRIEF DESCRIPTION OF THE DRAWINGS

FIG. 1: A view of the configuration diagram of a semiconductor memory device according to the first embodiment.

FIG. 2: A view of the configuration diagram of the conventional semiconductor memory device.

FIG. 3: A view of the waveform diagram showing a read-out operation of the semiconductor memory device of FIG. 2.

FIG. 4: A view of the waveform diagram showing a read-out operation (1) of the semiconductor memory device of FIG. 1.

FIG. 5: A view of the waveform diagram showing a read-out operation (2) of the semiconductor memory device of FIG. 1.

FIG. 6: A view of the configuration diagram of a semiconductor memory device according to the second embodiment.

DETAILED DESCRIPTION OF THE PREFERRED EMBODIMENTS

The aforementioned and other objects of the present invention and the novelty of the present invention will become clearer by the following detailed description of the preferred embodiments referring to the attached drawings. However, the attached drawings are only for explanation and do not limit the scope of the present invention.

First Embodiment

FIG. 1 is a view of the configuration diagram of a semiconductor memory device according to the first embodiment, and the identical elements to the ones of FIG. 2 are provided with the same numerals as in FIG. 2.

The semiconductor memory device thereof is a non-volatile memory being capable of one-time electrical writing and being inputting and outputting address signal or data between inside and outside circuits thereof using serial interface. However, the write circuit is omitted in FIG. 1.

The semiconductor memory device includes the address counter 11 for converting the address signal AD of the read-out select signal included in the serial signal SI provided from the outside to a parallel signal and for holding the above converted signal, the row decoder 12 being provided with the row address included in the address signal AD held in the address counter 11, and the column decoder 13 being provided with the column address included in the above address signal AD. The row decoder 12 decodes the row address from the address counter 11 and drives a word line of the memory-cell matrix 14. And the column decoder 13 decodes the column address from the address counter 11 and outputs the select signal to the multiplexer 15.

The memory-cell matrix 14 consists of a plural of word lines placed in parallel, a plural of drain lines placed across the above word lines, and MOS transistors having floating gates placed at each of the crossing points of the above word lines and the above drain lines as memory-cells. The control gate of the memory-cell is connected to the word line, the drain is connected to the drain line, the drain is connected to the drain line, the source is connected to the bit-line placed in parallel to the above drain line, and the above bit-line is connected to the multiplexer 15.

The multiplexer 15 selects bit-lines of one word (16 bit-lines in the case of the first embodiment) corresponding to the column address out of the bit-lines connected to the memory-cell matrix 14, based on the select signal from the column decoder 13 and connects the above 16 bit-lines to a sense amplifier 16. The sense amplifier 16 amplifies a slight voltage difference arisen between the above selected bit-lines to the predetermined logic level.

The data latch 17 for latching the one-word data from the above sense amplifier 16 at the timing of the latch signal LAT is connected to the output side of the sense amplifier 16. Furthermore, the output selector 18 and the output buffer 19 for selecting the 16-bit data held in the data latch 17 according to the timing signals SL0-SL15 from the controller 20 and for outputting the above selected data as the output data DO are connected to the output side of the data latch 17.

Moreover, the aforementioned semiconductor memory device includes the controller 20 for controlling the whole operation based on the chip select signal /CS and the clock signal CK given from the outside, the gate-voltage generating unit 21 and the drain-voltage generating unit 22 for driving the memory-cell matrix 14, and the activating control unit 23 for controlling the operations of the above gate-voltage generating unit 21 and drain-voltage generating unit 22 and the operation of the sense amplifier 16. The controller 20 outputs the activating signal ACT to the activating control unit 23, the latch signal LAT to the data latch 17, the output timing signals SL0-SL16 to the output selector 18, and the output enable signal OE and the output clocks OC, /OC to the output buffer 19, based on the clock signal CK.

The activating control unit 23 generates the operation control signal AC for controlling operations of the sense amplifier 16, the gate-voltage generating unit 21, and the drain-voltage generating unit 22 according to the activating signal ACT and the timing signals SL, SLO10. In other words, when the activating signal ACT is in active state ("H"), the activating control unit 23 is setting the operation control signal AC to active state, except during the period from the finishing time point of the timing signal SL (rising from "L" to "H") to the finishing time point of the signal SL10. Meanwhile, when the activating signal ACT is in non-active state ("L"), the operation control signal AC is in non-active state during the period from the finishing time point of the timing signal SL to the finishing time point of the signal SL10. As described before, the activating control unit 23 conducts controlling so as to halt operations of the sense amplifier 16, the gate-voltage generating unit 21, and the drain-voltage generating unit 22 in the first half of the operation to transfer serially the read-out data to the outside.

The gate-voltage generating unit 21 generates the gate-voltage VCW (for example, 3.6V) to drive the selected word line of the memory-cell matrix 14 when the operation control signal AC is in active state. Meanwhile, when the operation control signal AC is in non-active state, the output voltage from the gate-voltage generating unit 21 is the power-source voltage Vcc. At the same time, the drain-voltage generating unit 22 generates the drain-voltage CDV (for example, 1.0V) to be provided the drain line of the memory-cell matrix 14 when the operation control signal AC is in active state. Meanwhile, when the operation control signal AC is in non-active state, the output voltage from the drain-voltage generating unit 22 is the ground voltage GND.

FIG. 4 and FIG. 5 are signal waveform diagrams showing read-out operations (1), (2) of the semiconductor memory device of FIG. 1. The operations of FIG. 1 will be explained referring to the above FIG. 4 and FIG. 5, as follows.

FIG. 4 is a view of a signal waveform diagram in the normal read-out mode. The semiconductor memory device thereof is activated by falling of the chip select signal /CS, and then a serial signal SI from the outside is inputted serially synchronized with the rising edge of the clock signal CK, for example of 20 MHz. The first 8 bits of the above serial signal SI represents a command signal CMD for setting the operation mode, and it is assumed that a normal read mode is set in the case hereof. By the above mode setting, the enable signal NRD rises and the activating signal ACT rises. By rising of the activating signal ACT, the activating signal AC of the activating control unit 23 becomes "H", and then the gate-voltage generating unit 21 and the drain-voltage unit 22 is driven. Subsequently, the gate-voltage VCW rises from the power source voltage Vcc to 3.6V and the drain-voltage rises from the ground voltage GND to 1.0V. At the same time, the sense amplifier 16 is activated, too.

An 24-bit address signal AD of address signals A1, A2, A3 following the command signal CMD is set into the address counter 11. Subsequently, the address signal AD set in the address counter 11 is divided and provided the row decoder 12 and the column decoder 13, then the corresponding 16-bit address data is read out from the memory-cell matrix 14 through the multiplexer 15. The read data thereof is amplified to the predetermined logic level by the sense amplifier 16 and provided the data latch 17.

When the latch signal LAT from the controller 20 is changed to level "L", the data is inputted to the data latch 17, and when the latch signal is changed to level "H", the input data is held thereat. The latched data of the data latch 17 is provided the output selector 18 in parallel. The timing of the above latch signal LAT is set so as to be outputted synchronized with the timing signal SL0.

From the falling edge of the 32nd clock after address setting by the serial signal SI is finished, the output enable signal OE is turned to "H" and activated, then the output of the output clocks OC, /OC is started. Furthermore, the timing signals SL0-SL15 are turned to level "L" sequentially, and during the period of the above level "L", the data of the data latch 17 are sequentially transferred to the output buffer 19 through the output selector 18. The transferred data are serially outputted from the output buffer 19 as the output data DO, synchronized with output clocks OC, /OC.

During from rising of the timing signal SL0 to rising of the timing signal SL10 the activating control signal AC is being set to "L", the sense amplifier 16, the gate-voltage generating unit 21, and the drain-voltage generating unit 22 halt the operations. Subsequently, when the timing signal SL10 rises, the operation control signal AC is set to "H", then the sense amplifier 16, the gate-voltage generating unit 21, and the drain-voltage generating unit 22 resume the operations.

The value of the address counter 11 is counted up at every 16 clocks, and the sequential address data of the memory-cell matrix 14 are read out serially and sequentially.

FIG. 5 is a view of a waveform at the high-speed read-out mode.

In the high-speed read-out mode thereof, the read-out operation is conducted according to the clock signal CK faster than the normal read-out mode (for example, 50 MHz). In the high-speed read-out mode, the sequence is composed as follows. After the 24-bit address signal AD of the address signals A1, A2, A3 is provided following the command signal CMD setting the high-speed read-out mode, a dummy cycle of eight clocks acquiring time for the first read-out is inputted, then the read-out operation starts. The operations thereafter are the same as in the normal mode of FIG. 4.

As explained before, the semiconductor memory device according to the first embodiment includes the activating control unit 23 controlling so as to halt operations of the sense amplifier 16, the gate-voltage generating unit 21, and the drain-voltage generating unit 22 except during the period for reading out next one word (total six-clock period consisting of indispensable 100 ns=five 50 MHz-clocks and one-clock for margin against malfunction) after one-word (16 bits) data is read out from the memory-cell matrix 14 and held in the data latch 17. By the above configuration, the operation time of the sense amplifier 16 and the gate-voltage generating unit 21, and the drain-voltage generating unit 22 during the read-out operation is reduced to the six-sixteenths of the conventional time, and then there is an advantage that the power consumption can be reduced.

Second Embodiment

FIG. 6 is a view of configuration diagram showing the second embodiment of the present invention and elements identical to the ones of FIG. 1 are provided with the same numerals as in FIG. 1.

The above semiconductor memory device is configured to include a similar activating control unit 24 addition to the activating control unit 23 in FIG. 1 and also include a selector 25 for selecting one of output signals AC1, AC2 of the activating control units 23, 24 and for providing the sense amplifier 16, the gate-voltage generating unit 21, and the drain-voltage generating unit 22 with the above selected signal as the activating signal AC.

The activating control unit 24 is setting the output signal AC2 to active state except during from the finishing time point of the timing signal SL0 to the finishing time point of the timing signal SL13 when the activating signal ACT is in active sate. However, when the activating signal ACT is non-active state, the output signal AC2 is being set to non-active state during from the finishing time point of the timing signal SL0 to the finishing time point of the timing signal SL13.

Furthermore, the selector 25 selects the output signal AC1 of the activating control unit 23 when an enable signal FRD indicating the high-speed read-out mode is given, and selects the output signal AC2 of the activating control unit 24 when an enable signal NRD indicating the normal read-out mode is given, so as to provide the sense amplifier 16, the gate-voltage generating unit 21, and the drain-voltage generating unit 22 with the above selected signal as the operation control signal AC.

The operation of the above semiconductor memory device in the high-speed read-out mode is the same as in the first embodiment. Meanwhile, the output signal AC2 of the activating control unit 24 is selected by the selector 25 in the normal read-out mode. The output signal AC2 of the activating control unit 24 is being set to non-active sate during 13-clock period from the finishing time point of the timing SL0 to the finishing time point of the timing SL13. In other words, the non-active state period lasts for 3-clock period. However, since the clock frequency of the normal read-out mode is 20 MHz, time of the 3-clock period is 150 ns, and then the above time can be enough to cover the period for reading out one-word data from the memory-cell matrix 14 (100 ns).

Consequently, in the semiconductor memory device according to the second embodiment, the operation time of the sense amplifier 16, the gate-voltage generating unit 21, and the drain-voltage generating unit 22 during the normal read-out mode is reduced to three sixteenths of the conventional operation time, and then there is an advantage that the power consumption can be reduced further than the first embodiment.

The present invention is not limited to the aforementioned embodiments, and can be modified variously. For example, the above modification samples are as follows.

(1) According to the embodiments, non-volatile memory capable being capable of one-time electrical writing is the object, however, the embodiments can be applied to mask ROMs not being necessary to conduct electrical writing.

(2) The period when the operations of the sense amplifier 16, the gate-voltage generating unit 21, and the drain-voltage generating unit 22 are being halted by the activating control units 23, 24 is not limited to the aforementioned example, however, it is necessary to set an appropriate timing based on the clock frequency of an applied semiconductor memory device and data read-out time from a memory-cell matrix.

(3) According to the second embodiment (FIG. 6), the activating control units 23, 24 corresponding to the high-speed read-out mode and the normal read-out mode are included, furthermore, the selector 25 for selecting the output signals of the above activating control units 23, 24 according to the operation mode is included, however, circuit simplification can be done by a configuration to include a selector for selecting and providing the timing signal SL10 or SL13 according to the operation mode instead of the timing signal SL10 given to the activating control unit 23 of the first embodiment (FIG. 1).

(4) Object circuits to be controlled by the activating control signal AC are not limited to the sense amplifier 16, the gate-voltage generating unit 21, and the drain-voltage generating unit 2.

What is claimed is:

1. A semiconductor memory device comprising;
   a memory-cell matrix being configured to include a plural of memory-cells placed in matrix shape and output in parallel one-word signal of an address selected by a read-out select signal;
   an amplifying unit being configured to amplify said one-word signal outputted in parallel from said memory-cell matrix and generate one-word data;
   a data holding unit being configured to hold said one-word data generated by said amplifying unit;
   a data output unit being configured to output serially said one-word data held in said data holding unit according to an output timing signal;
   a voltage generating unit being configured to generate a voltage for generating said read-out select signal; and
   an activating control unit being configured to output an operation control signal for activating said voltage generating unit and said amplifying unit based on said output timing signal, during from when said read-out select signal is generated to when said one-word signal is outputted from said memory-cell matrix based on said read-out select signal and held in said data holding unit.

2. The semiconductor memory device according to claim 1, wherein said activating control unit is configured to change activating timings of said operation control signals corresponding to a clock frequency having a function of origin of said timing signals.

* * * * *